(12) United States Patent
Fedan

(10) Patent No.: US 8,130,050 B2
(45) Date of Patent: Mar. 6, 2012

(54) DUAL TABLE TEMPERATURE COMPENSATED VOLTAGE CONTROLLED CRYSTAL OSCILLATOR SYSTEM AND METHOD

(75) Inventor: Orest Fedan, Belmont, MA (US)

(73) Assignee: LoJack Operating Company, LP, Westwood, MA (US)

( * ) Notice: Subject to any disclaimer, the term of this patent is extended or adjusted under 35 U.S.C. 154(b) by 0 days.

(21) Appl. No.: 12/589,430

(22) Filed: Oct. 23, 2009

(65) Prior Publication Data

US 2011/0095834 A1    Apr. 28, 2011

(51) Int. Cl.
    *H03B 5/32*    (2006.01)
(52) U.S. Cl. ........................... 331/158; 331/176
(58) Field of Classification Search .............. 331/176, 331/66, 116 R, 116 FE, 158
    See application file for complete search history.

(56) References Cited

U.S. PATENT DOCUMENTS 6,215,990 B1 *  4/2001  Kidd .......................... 455/255
7,123,106 B2 * 10/2006  Zhang et al. ................... 331/66

* cited by examiner

*Primary Examiner* — Ryan Johnson
(74) *Attorney, Agent, or Firm* — Iandiorio Teska & Coleman, LLP

(57) ABSTRACT

Dual table temperature compensation for a voltage controlled crystal oscillator is achieved by sensing the temperature of the voltage controlled crystal oscillator (VCXO), retrieving from a first table the frequency error with variations in the temperature sensed, retrieving from a second table the oscillator control voltage corresponding to the frequency error from the first table and applying the oscillator control voltage to the VCXO.

11 Claims, 5 Drawing Sheets

DUAL TABLE TEMPERATURE COMPENSATED VOLTAGE CONTROLLED CRYSTAL OSCILLATOR SYSTEM AND METHOD

FIELD OF THE INVENTION

This invention relates to a dual table temperature compensated voltage controlled crystal oscillator system and method.

BACKGROUND OF THE INVENTION

Voltage controlled crystal oscillators (VCXOs) have a tendency to drift in frequency with variations in temperature. Each VCXO has a different characteristic of temperature vs. frequency drift which can be measured at a single point e.g. 24° C. and 8.61063 MHz. Then each oscillator will have a single point calibration e.g. 24° C. and 8.61063 MHz at which it is accurate. However, for the rest of the operating range e.g. −30° C. to +85° C. this will not be so. To correct this each of the temperature vs. frequency characteristics of the batch of VCXOs is averaged to provide an average or normal characteristic of frequency variation with temperature. This average variation can be compensated with equal and opposite values which can be stored in a table of frequency (ppm) vs. degrees ° C. and applied to the VCXO to provide proper average compensation. To improve the compensation for any given VCXO, the single point calibration intrinsic to it is applied to that PPM vs. ° C. table by shifting all PPM values by the same amount so that the 24° C. value is accurate. However, this still may result in error because the compensation is achieved by adjusting the control voltage of the VCXO to obtain the desired correction of frequency but the relationship between the control voltage and frequency is not linear and so some error still persists.

SUMMARY OF THE INVENTION

In accordance with various aspects of the subject invention in at least one embodiment the invention presents an improved dual table temperature compensated voltage controlled crystal oscillator system and method which provides greater accuracy over a wide range of temperatures.

The subject invention results from the realization, in part, that an improved dual table temperature compensated voltage controlled crystal oscillator system and method in various aspects can be achieved by a voltage controlled crystal oscillator (VCXO); a temperature sensor for sensing the temperature of the VCXO; a microcontroller for storing a first table of values of frequency error with variation in the sensed temperature, and a second table of values of oscillator control voltage with variation of the frequency error and configured to apply the sensed temperature to the first table to obtain the frequency error corresponding to that temperature and to apply the frequency error to the second table to obtain the control voltage and applying the doubly compensated control voltage to the VCXO.

The subject invention, however, in other embodiments, need not achieve all these objectives and the claims hereof should not be limited to structures or methods capable of achieving these objectives.

This invention features a dual table temperature compensated voltage controlled crystal oscillator system including a voltage controlled crystal oscillator (VCXO), a temperature sensor for sensing the temperature of the VCXO and a microcontroller for storing a first table of values of frequency error with variation in the sensed temperature, and a second table of values of oscillator control voltage with variation of the frequency error and configured to apply the sensed temperature to the first table to obtain the frequency error corresponding to that temperature and to apply the frequency error to the second table to obtain the control voltage and applying the doubly compensated control voltage to the VCXO.

In preferred embodiments the microcontroller may include a digital to analog converter responsive to the second table for providing a temperature compensated voltage to the VCXO. The microcontroller may be further configured for applying a first voltage to the second table which results in an apparent zero error, measuring the frequency, calculating the actual first error, and calculating a second voltage from the second table which should result in an apparent zero error. The microcontroller may be further configured for applying a second voltage which should yield an apparent zero error, measuring the frequency and calculating the actual second error. The microcontroller may be further configured for shifting the first and second tables to compensate for the second and first errors, respectively.

This invention also features a dual table temperature compensated method for a voltage controlled crystal oscillator including sensing the temperature of the voltage controlled crystal oscillator (VCXO), retrieving from a first table the frequency error with variations in the temperature sensed, retrieving from a second table the oscillator control voltage corresponding to the frequency error from the first table and applying the oscillator control voltage to the VCXO.

In preferred embodiments the method may further include applying a single point calibration to each of the tables. Retrieving in the first and second tables may include applying a first voltage to the second table which results in an apparent zero error, measuring the frequency, calculating the actual first error, and calculating a second voltage from the second table which should result in an apparent zero error. Retrieving from the second table may include applying a second voltage which should yield an apparent zero error, measuring the frequency and calculating the actual second error. The method may further include shifting the first and second tables to compensate for the second and first errors, respectively.

BRIEF DESCRIPTION OF THE SEVERAL VIEWS OF THE DRAWINGS

Other objects, features and advantages will occur to those skilled in the art from the following description of a preferred embodiment and the accompanying drawings, in which.

DETAILED DESCRIPTION OF THE INVENTION

Figure 1:
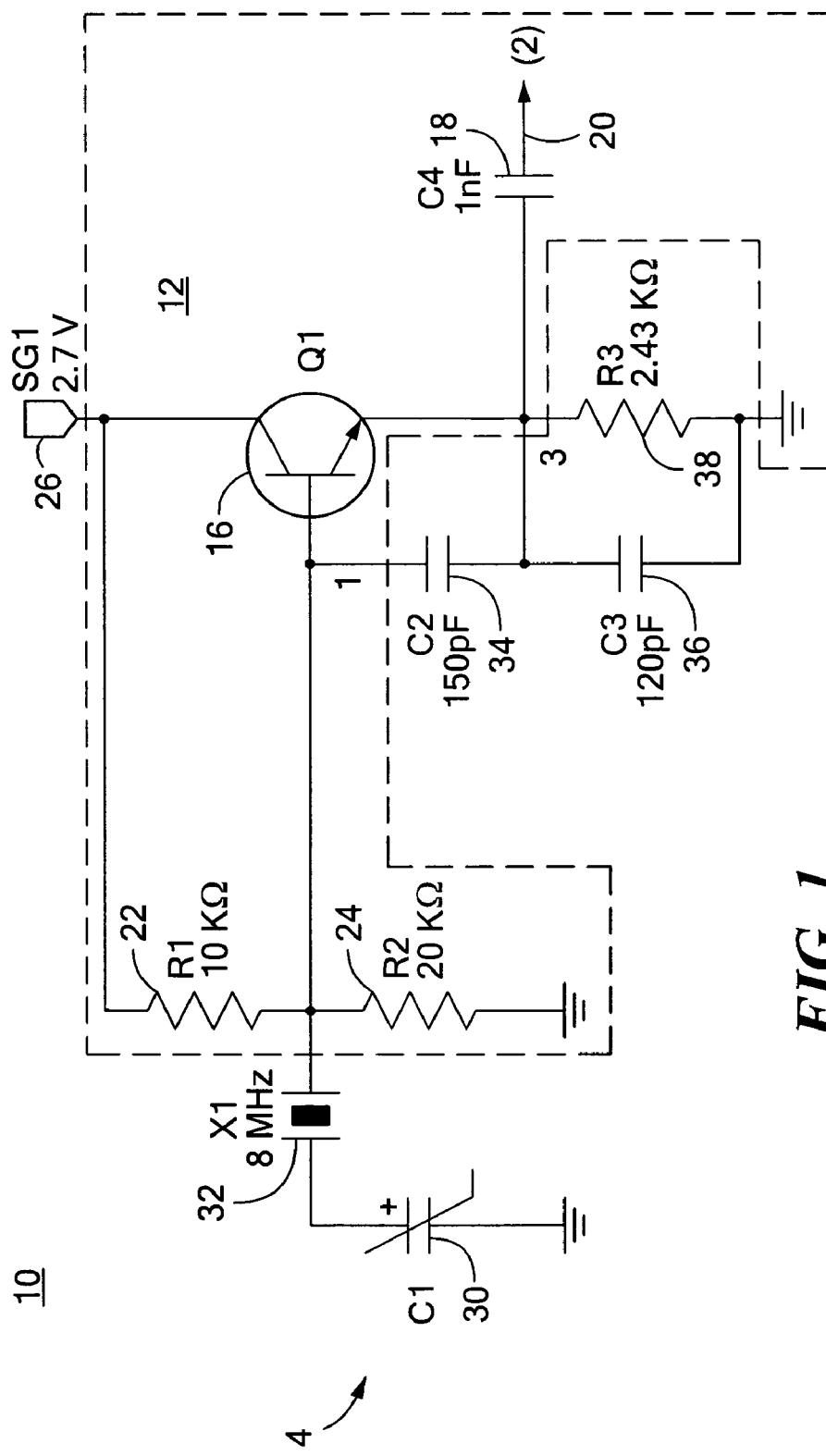
FIG. 1 is a schematic diagram of a conventional voltage controlled crystal oscillator (VCXO)

Aside from the preferred embodiment or embodiments disclosed below, this invention is capable of other embodiments and of being practiced or being carried out in various ways. Thus, it is to be understood that the invention is not limited in its application to the details of construction and the arrangements of components set forth in the following description or illustrated in the drawings. If only one embodiment is described herein, the claims hereof are not to be limited to that embodiment. Moreover, the claims hereof are not to be read restrictively unless there is clear and convincing evidence manifesting a certain exclusion, restriction, or disclaimer.

There is shown in FIG. 1 a conventional prior art voltage controlled crystal oscillator 10 (VCXO) configured as a Colpitts oscillator using a bi-polar transistor connected as a common collector. Oscillator 10 includes an amplifier 12 and tank circuit 14. Amplifier 12 includes bi-polar transistor 16, coupling capacitor 18 which provides the output on line 20 and voltage divider resistors 22 and 24. Input power is provided at terminal 26. Tank circuit 14 includes voltage controlled capacitor 30, crystal resonator 32, negative resistance feedback capacitors 34 and 36 and emitter resistance 38. Emitter resistance may also be considered as a part of amplifier circuit 12.

In operation, resistances 22 and 24 set the average base voltage on transistor 16 around which the alternating current varies. Any perturbation starts current flowing either in the positive direction from voltage controlled capacitance 30 through capacitance 34 and then capacitance 36 or in the opposite, negative, direction from capacitance 36 through capacitor 34 and then through capacitor 30. Assuming a positive flow from capacitor 30 through 34 through 36, capacitor 34 charges, turning on transistor 16 harder; more current flows from the collector through the emitter. The emitter current flows mostly through capacitance 36 and some through resistance 38. As the cycle reverses capacitance 36 is now at a higher voltage so a stronger reverse current is generated. Capacitance 34 thus discharges to a lower voltage because reverse current is stronger than it would have been and so it turns transistor 16 off harder. This drops the voltage on capacitance 36 and so capacitance 36 loses more charge than it would have if transistor 16 wasn't turned off so hard. And the cycle continues in this manner.

Figure 2:
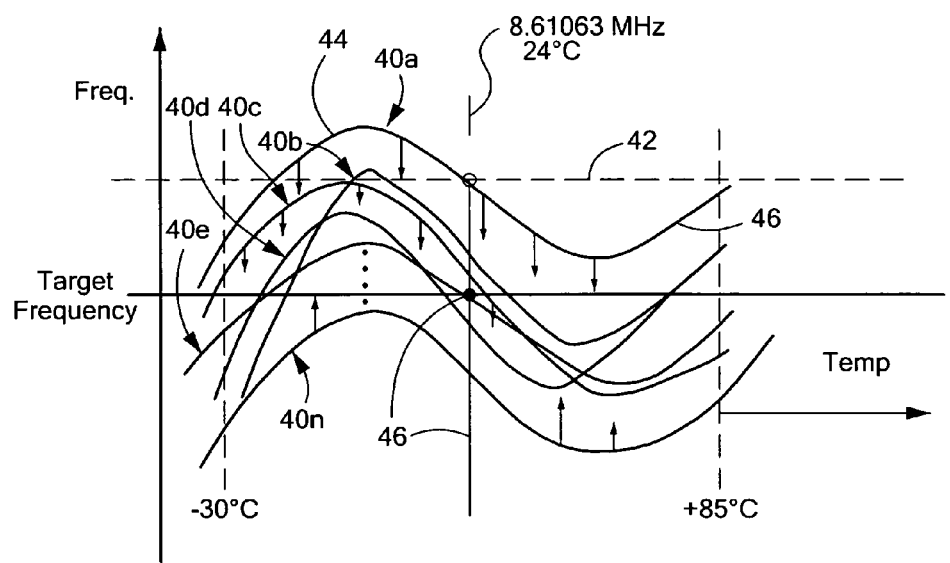
FIG. 2 illustrates frequency versus temperature characteristics for a number of VCXO's.

Voltage controlled crystal oscillators (VCXO) such as VCXO 10, FIG. 1, have a tendency to drift in frequency with variations in temperature. And each VCXO has a different characteristic of temperature versus frequency drift. These variations and behavior can be due to the cut size of crystal resonator 32, the cut angle of crystal resonator 32, and the general temperature variations and the behavior of the various capacitors, resistors and transistor 16 as is well known. Each VCO has a different characteristic of temperature versus frequency drift. For example, as shown in FIG. 2, there are a number of characteristics 40a, 40b, 40c, 40d, 40e, ... 40n. All of these characteristics 40a-40n can be normalized or calibrated to a single target frequency, for example, in FIG. 2, 8.61063 MHz at a particular temperature, again for example, 24° C. None of these characteristics 40a-40n are linear, rather they all have an almost sinusoidal shape in the conventional operating range of −30° C. to +85° C. The characteristic first goes above an ideal horizontal line 42 shown with respect to characteristic 40a only, so that the first portion 44 of characteristic 40a is positive indicating that the frequency rises with temperature and in the second part 46 it falls indicating that further increases in temperature actually decrease the frequency. By shifting each of the characteristics 40a-40n up or down to facilitate their passing through the target frequency point 46, all of the VCXO's are single calibrated to that point. However, the rest of the operation at other temperatures suffers from the excursion of each characteristic as exemplified with respect to the discussion of portions 44 and 46 of characteristic 40a.

Figure 3:
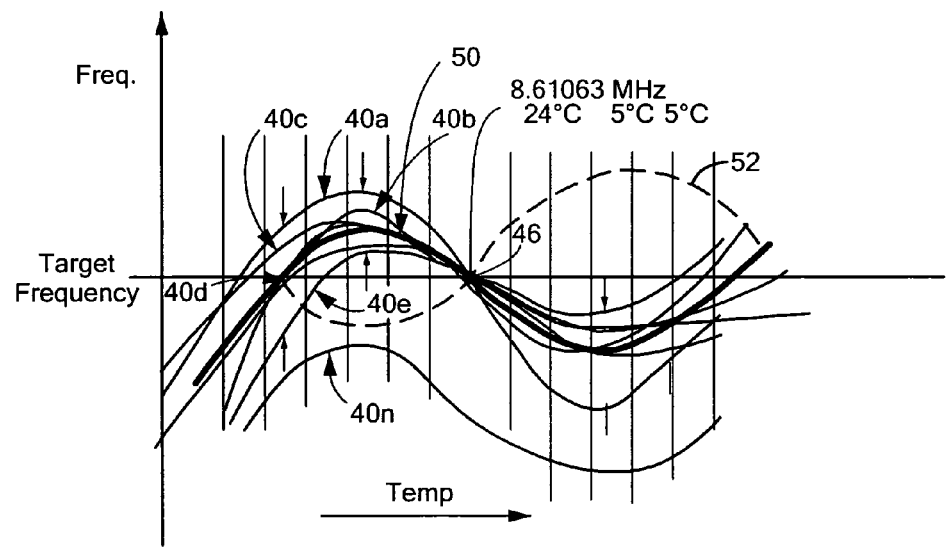
FIG. 3 illustrates the frequency versus temperature characteristics of FIG. 2 after single point calibration along with an average characteristic and a compensation characteristic.

To compensate for this all of the characteristics 40a-40n that have been single point calibrated to the target frequency point 46 can be averaged to provide a typical or average characteristic 50, FIG. 3. In keeping with conventional practice an equal and opposite compensation characteristic 52 can be constructed which is then converted to a table of values in a look up table. This is done typically by using the sensed temperatures as the access address in a table which then gives the frequency shift required to keep the target frequency at that temperature. This approach neatly offsets the temperature variations to provide a more linear compensated frequency operation. Conventionally then the temperature of the VCXO is sensed and that temperature is used to access the appropriate control voltage but the frequency vs control voltage characteristic is still less than linear.

Figure 4:
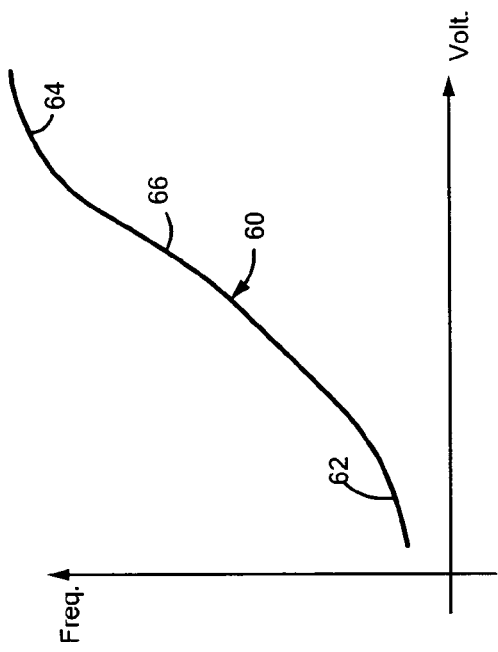
FIG. 4 illustrates a frequency versus control voltage characteristic revealing the non-linearity inherent in applying the compensation characteristic of FIG. 3.

This is apparent in FIG. 4 where the characteristic 60 of frequency versus voltage is not linear but has both a curved toe portion 62 and a curved shoulder portion 64 between which is a more linear but still not totally linear central portion 66.

Figure 5:
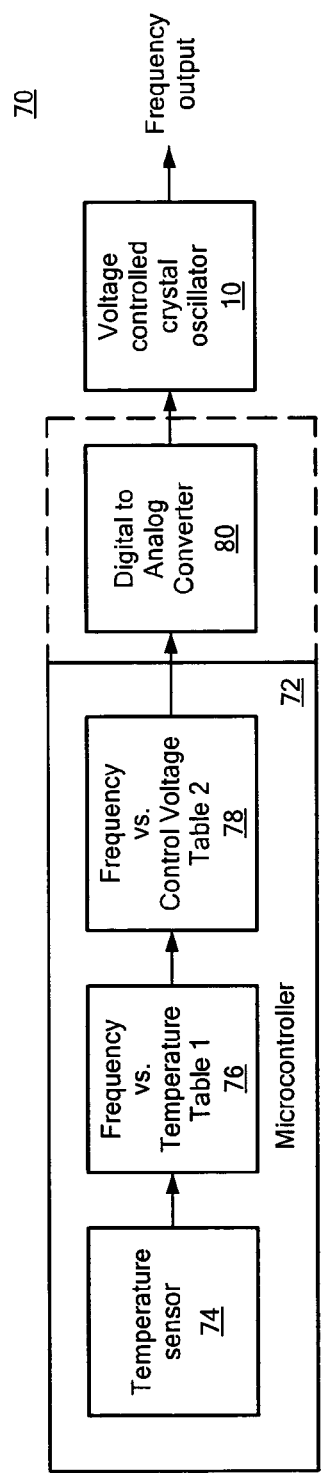
FIG. 5 is a schematic block diagram of a dual table temperature compensated VCXO system according to this invention.

In accordance with this invention a dual table temperature compensated VCXO system 70, FIG. 5, includes a microcontroller 72 associated with VCXO 10. Microcontroller 72 includes a temperature sensor 74, a frequency versus temperature look up Table 1, 76 and a frequency versus voltage control voltage Table 2, 78. It may also include digital to analog converter 80 and may be implemented, for example, with a MSP430F168 microprocessor. Microcontroller 72 stores the table of values of frequency error with variations in the sensed temperature in Table 1 and the table of values of oscillator control voltages with variation in frequency error in Table 2, below.

TABLE 1

| Index | Degrees C. | Frequency ppm |
|---|---|---|
| 0 | −42.2 | 9.29 |
| 1 | −38.1 | 5.58 |
| 2 | −34 | 2.45 |
| 3 | −29.8 | −0.14 |
| 4 | −25.7 | −2.23 |
| 5 | −21.6 | −3.84 |
| 6 | −17.4 | −5.02 |
| 7 | −13.3 | −5.79 |
| 8 | −9.2 | −6.19 |
| 9 | −5 | −6.25 |
| 10 | −0.9 | −6 |
| 11 | 3.3 | −5.49 |
| 12 | 7.4 | −4.73 |
| 13 | 11.6 | −3.77 |
| 14 | 15.7 | −2.64 |
| 15 | 19.9 | −1.37 |
| 16 | 24 | 0 |
| 17 | 28.1 | 1.44 |
| 18 | 32.3 | 2.93 |
| 19 | 36.4 | 4.41 |
| 20 | 40.6 | 5.87 |
| 21 | 44.7 | 7.27 |
| 22 | 48.8 | 8.56 |
| 23 | 53 | 9.73 |
| 24 | 57.1 | 10.74 |
| 25 | 61.2 | 11.55 |
| 26 | 65.4 | 12.13 |
| 27 | 69.5 | 12.45 |
| 28 | 73.6 | 12.47 |
| 29 | 77.7 | 12.16 |

TABLE 1-continued

| Index | Degrees C. | Frequency ppm |
|---|---|---|
| 30 | 81.8 | 11.49 |
| 31 | 86 | 10.42 |

TABLE 2

| Index | ppm | Volts |
|---|---|---|
| 0 | −74 | 0.3 |
| 1 | −68 | 0.4 |
| 2 | −61.9 | 0.5 |
| 3 | −56.44 | 0.6 |
| 4 | −50.29 | 0.7 |
| 5 | −44.13 | 0.8 |
| 6 | −38.09 | 0.9 |
| 7 | −31.94 | 1 |
| 8 | −25.67 | 1.1 |
| 9 | −19.4 | 1.2 |
| 10 | −13.01 | 1.3 |
| 11 | −6.5 | 1.4 |
| 12 | 0 | 1.5 |
| 13 | 6.62 | 1.6 |
| 14 | 13.36 | 1.7 |
| 15 | 20.09 | 1.8 |
| 16 | 26.94 | 1.9 |
| 17 | 33.8 | 2 |
| 18 | 40.76 | 2.1 |
| 19 | 47.62 | 2.2 |
| 20 | 54.35 | 2.3 |
| 21 | 61.09 | 2.4 |
| 22 | 67.59 | 2.5 |
| 23 | 73.98 | 2.6 |
| 24 | 79.9 | 2.7 |

Microcontroller 72 applies the sensed temperature to Table 1 to obtain the frequency error corresponding to that temperature and then applies that frequency error to Table 2 to obtain the doubly compensated control voltage and it applies that control voltage to digital to analog converter 80, which may be a part of microcontroller 72, to convert the digital outputs to analog voltages to drive VCXO 10.

Figure 6:
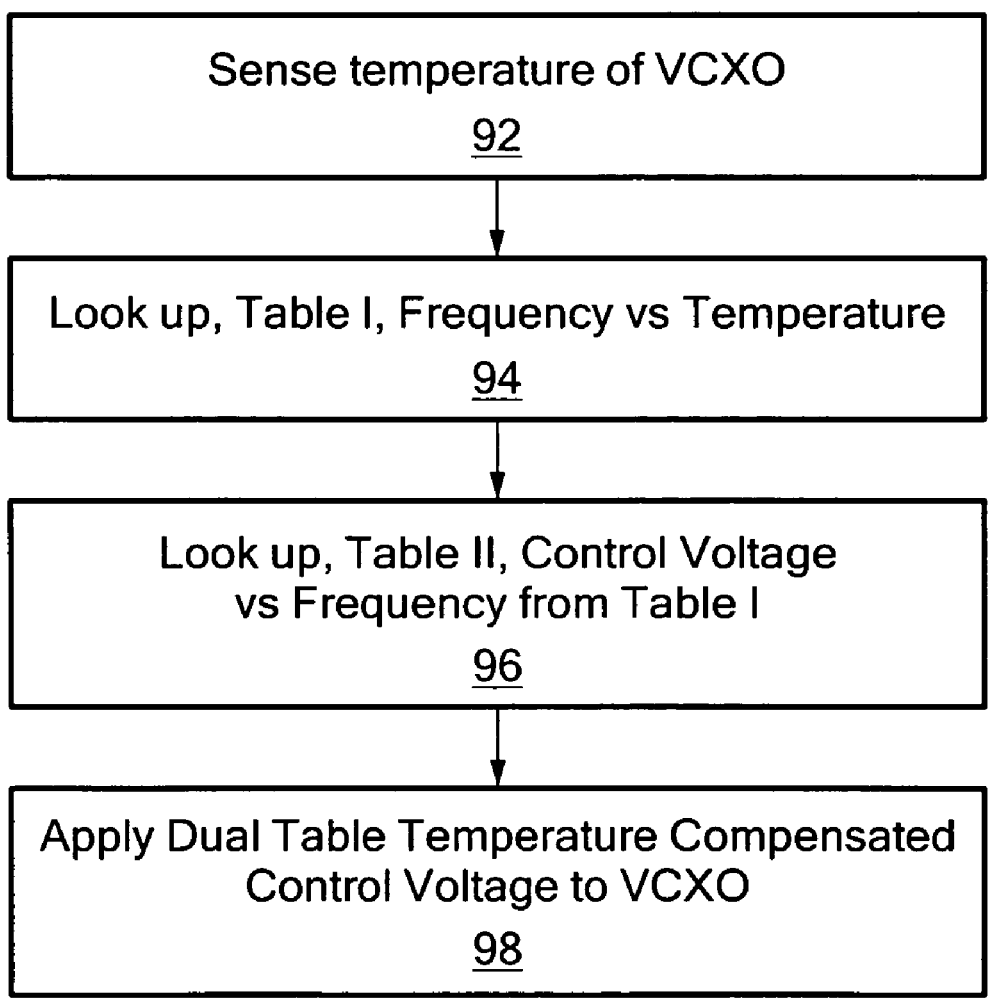
FIG. 6 is a flow chart of a dual table temperature compensated VCXO method according to this invention.

The method 90, FIG. 6, according to this invention includes sensing the temperature 92 of the VCXO. Subsequently the sensed temperature is used to look up, 94, in Table 1 the frequency error at that temperature. Then Table 2 is used to look up, 96, the control voltage necessary for the frequency found in Table 1. This dual table temperature compensated control voltage is then applied 98 to the VCXO 10.

Figure 7:
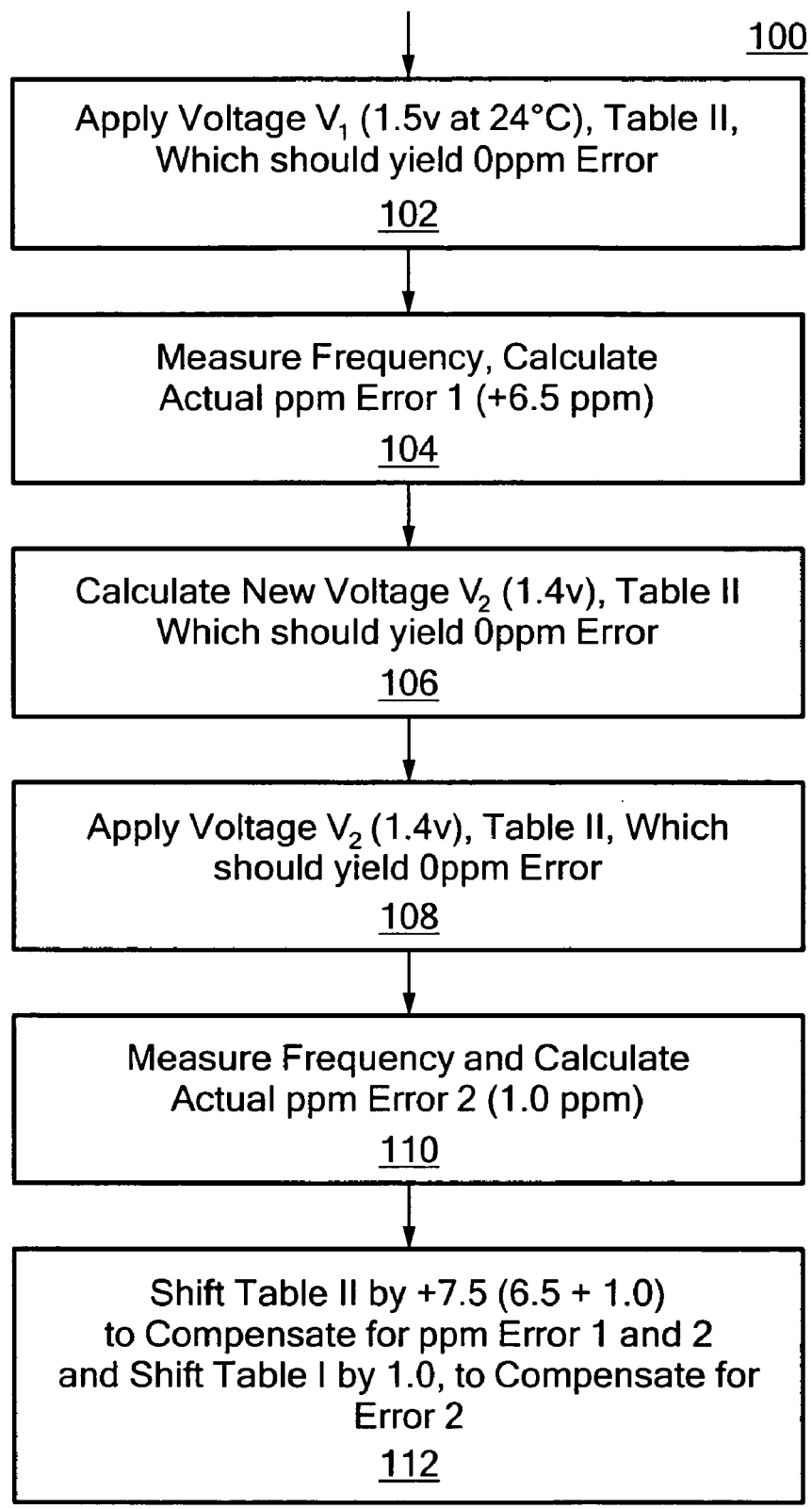
FIG. 7 is a flow chart showing the adjustment of both tables according to this invention.

For the purpose of performing a single point calibration, microcontroller 70 is employed in conjunction the table look ups in accordance with the flow chart 100, FIG. 7. In this embodiment controller 72 adjusts both look up Tables 1 and 2 but begins with applying a voltage V1, 102 of 1.5 volts at 24° C. at index 12 of Table 2. This should yield, as shown, a zero ppm error. But assume it shows an error of +6.5 ppm. The frequency is then measured, 104, to calculate the actual ppm error. A new voltage $V_2$ is calculated, 106, to be 1.4 volts. Applying this to Table 2 produces a ppm of −6.5 which just offsets the +6.5 ppm error. So there should be a zero error 108. The frequency is then measured and the actual error is calculated 110 error 2. Assuming it shows an error of 1.0 ppm, Table 2 is then shifted 112 by a factor of +7.5 ppm. That is 6.5 ppm from the first error and 1.0 ppm from the second error. This compensates for errors one and two. Table 1 is then shifted by +1.0 ppm to compensate for error two. In this way both tables are adjusted at the same time for the existing errors.

Although specific features of the invention are shown in some drawings and not in others, this is for convenience only as each feature may be combined with any or all of the other features in accordance with the invention. The words "including", "comprising", "having", and "with" as used herein are to be interpreted broadly and comprehensively and are not limited to any physical interconnection. Moreover, any embodiments disclosed in the subject application are not to be taken as the only possible embodiments.

In addition, any amendment presented during the prosecution of the patent application for this patent is not a disclaimer of any claim element presented in the application as filed: those skilled in the art cannot reasonably be expected to draft a claim that would literally encompass all possible equivalents, many equivalents will be unforeseeable at the time of the amendment and are beyond a fair interpretation of what is to be surrendered (if anything), the rationale underlying the amendment may bear no more than a tangential relation to many equivalents, and/or there are many other reasons the applicant can not be expected to describe certain insubstantial substitutes for any claim element amended.

Other embodiments will occur to those skilled in the art and are within the following claims.

What is claimed is:

1. A dual table temperature compensated voltage controlled crystal oscillator system comprising:
    a voltage controlled crystal oscillator (VCXO);
    a temperature sensor for sensing the temperature of said VCXO;
    a microcontroller configured for storing a first table of values of frequency error with variation in said sensed temperature, and a second table of values of oscillator control voltage with variation of said frequency error and configured to apply the sensed temperature to said first table to obtain the frequency error corresponding to that temperature and to apply said frequency error to said second table to obtain the control voltage and applying the doubly compensated said control voltage to said VCXO, and configured for measuring a frequency, calculating an actual first error, and shifting said first table or said second table to compensate for said actual error.

2. The dual table temperature compensated VCXO system of claim 1 in which said microcontroller includes a digital to analog converter responsive to said second table for providing a temperature compensated voltage to said VCXO.

3. The dual table temperature compensated VCXO system of claim 1 in which said microcontroller is further configured for applying a first voltage to said second table which results in an apparent zero error, measuring the frequency, calculating the actual first error, and calculating a second voltage from said second table which should result in an apparent zero error.

4. The dual table temperature compensated VCXO system of claim 3 in which said microcontroller is further configured for applying a second voltage which should yield an apparent zero error, measuring the frequency and calculating the actual second error.

5. The dual table temperature compensated VCXO system of claim 4 in which said microcontroller is further configured for shifting said first and second tables to compensate for said second and first errors, respectively.

6. A dual table temperature compensated method for a voltage controlled crystal oscillator comprising:
    sensing a temperature of the voltage controlled crystal oscillator (VCXO);
    retrieving from a first table a frequency error with variations in the temperature sensed;

retrieving from a second table the oscillator control voltage corresponding to the frequency error from said first table;

applying the oscillator control voltage to the VCXO;

measuring a frequency;

calculating an first actual error; and shifting said first table or said second table to compensate for said actual error.

7. The dual table temperature compensated method of claim 6 in which retrieving in said first and second tables includes applying a first voltage to said second table which results in an apparent zero error, measuring the frequency, calculating the actual first error, and calculating a second voltage from said second table which should result in an apparent zero error.

8. The dual table temperature compensated method of claim 7 in which retrieving from said second table includes applying a second voltage which should yield an apparent zero error, measuring the frequency and calculating the actual second error.

9. The dual table temperature compensated method of claim 8 further including shifting both of said first and second tables to compensate for said second and first errors, respectively.

10. A dual table temperature compensated voltage controlled crystal oscillator system comprising:

a voltage controlled crystal oscillator (VCXO);

a temperature sensor for sensing the temperature of said VCXO;

a microcontroller configured for storing a first table of values of frequency error with variation in said sensed temperature, and a second table of values of oscillator control voltage with variation of said frequency error and configured to apply the sensed temperature to said first table to obtain the frequency error corresponding to that temperature and to apply said frequency error to said second table to obtain the control voltage and applying the doubly compensated said control voltage to said VCXO;

said microcontroller further configured for applying a first voltage to said second table which results in an apparent zero error, measuring the frequency, calculating the actual first error, calculating a second voltage from said second table which should result in an apparent zero error, applying a second voltage which should yield an apparent zero error, measuring the frequency and calculating the actual second error, and shifting said first and second tables to compensate for said second and first errors, respectively.

11. A dual table temperature compensated method for a voltage controlled crystal oscillator comprising:

sensing a temperature of the voltage controlled crystal oscillator (VCXO);

retrieving from a first table a frequency error with variations in the temperature sensed and retrieving from a second table the oscillator control voltage corresponding to the frequency error from said first table, including applying a first voltage to said second table which results in an apparent zero error, measuring the frequency, calculating the actual first error, applying a second voltage which should yield an apparent zero error, measuring the frequency and calculating the actual second error;

applying the oscillator control voltage to the VCXO; and shifting said first and second tables to compensate for said second and first errors, respectively.

\* \* \* \* \*